(12) United States Patent
Wang

(10) Patent No.: US 10,148,018 B2
(45) Date of Patent: Dec. 4, 2018

(54) POWER DISTRIBUTING SOCKET AND POWER DISTRIBUTING UNIT USING THE SAME

(71) Applicant: CLOUD NETWORK TECHNOLOGY SINGAPORE PTE. LTD., Singapore (SG)

(72) Inventor: Chia-Peng Wang, New Taipei (TW)

(73) Assignee: Cloud Network Technology Singapore Pte. Ltd., Singapore (SG)

( * ) Notice: Subject to any disclaimer, the term of this patent is extended or adjusted under 35 U.S.C. 154(b) by 11 days.

(21) Appl. No.: 15/473,840

(22) Filed: Mar. 30, 2017

(65) Prior Publication Data

US 2018/0183194 A1 Jun. 28, 2018

(30) Foreign Application Priority Data

Dec. 23, 2016 (CN) .......................... 2016 1 1208544

(51) Int. Cl.
| | |
|---|---|
| H01R 4/66 | (2006.01) |
| H01R 4/30 | (2006.01) |
| H01R 25/00 | (2006.01) |
| H02G 3/08 | (2006.01) |
| H02J 4/00 | (2006.01) |
| H05K 7/02 | (2006.01) |
| H01R 25/16 | (2006.01) |

(52) U.S. Cl.
CPC ............. H01R 4/30 (2013.01); H01R 25/003 (2013.01); H02G 3/08 (2013.01); H02J 4/00 (2013.01); H05K 7/026 (2013.01); *H01R 25/161* (2013.01)

(58) Field of Classification Search
CPC ... H01R 13/652; H01R 25/006; H01L 23/552; H02H 3/093
USPC ........................... 439/106, 107; 361/118, 95
See application file for complete search history.

(56) References Cited

U.S. PATENT DOCUMENTS

| | | | | |
|---|---|---|---|---|
| 7,457,106 B2 * | 11/2008 | Ewing | ............... | H01R 25/006 340/635 |
| 7,726,825 B2 * | 6/2010 | Mandapat | ............ | H01R 25/003 361/118 |
| 8,052,437 B2 * | 11/2011 | Jiang | .................... | H01R 25/003 439/106 |
| 2009/0213567 A1 * | 8/2009 | Mandapat | .......... | H01R 13/7175 362/95 |

* cited by examiner

*Primary Examiner* — Phuong Chi T Nguyen
(74) *Attorney, Agent, or Firm* — ScienBiziP, P.C.

(57) ABSTRACT

A power distributing socket in a power distributing unit includes an insulating chassis and a circuit unit embedded in the insulating chassis. The circuit unit includes an input end and an output end, each end is connected to a locking terminal. Each of the locking terminals defines a first locking hole. The power distributing unit is further disclosed.

15 Claims, 3 Drawing Sheets

POWER DISTRIBUTING SOCKET AND POWER DISTRIBUTING UNIT USING THE SAME

FIELD

The subject matter herein generally relates to a power distributing socket and power distributing units using the power distributing socket.

BACKGROUND

Power distribution units (PDUs) are utilized to distribute power to one or more electronic devices. These PDUs often have a housing, a power input for delivering power to the housing, and one or more power outlets mounted in the housing for distribution of power from the input to other electronic units.

BRIEF DESCRIPTION OF THE DRAWINGS

Implementations of the present technology will now be described, by way of example only, with reference to the attached figures.

DETAILED DESCRIPTION

Figure 1:
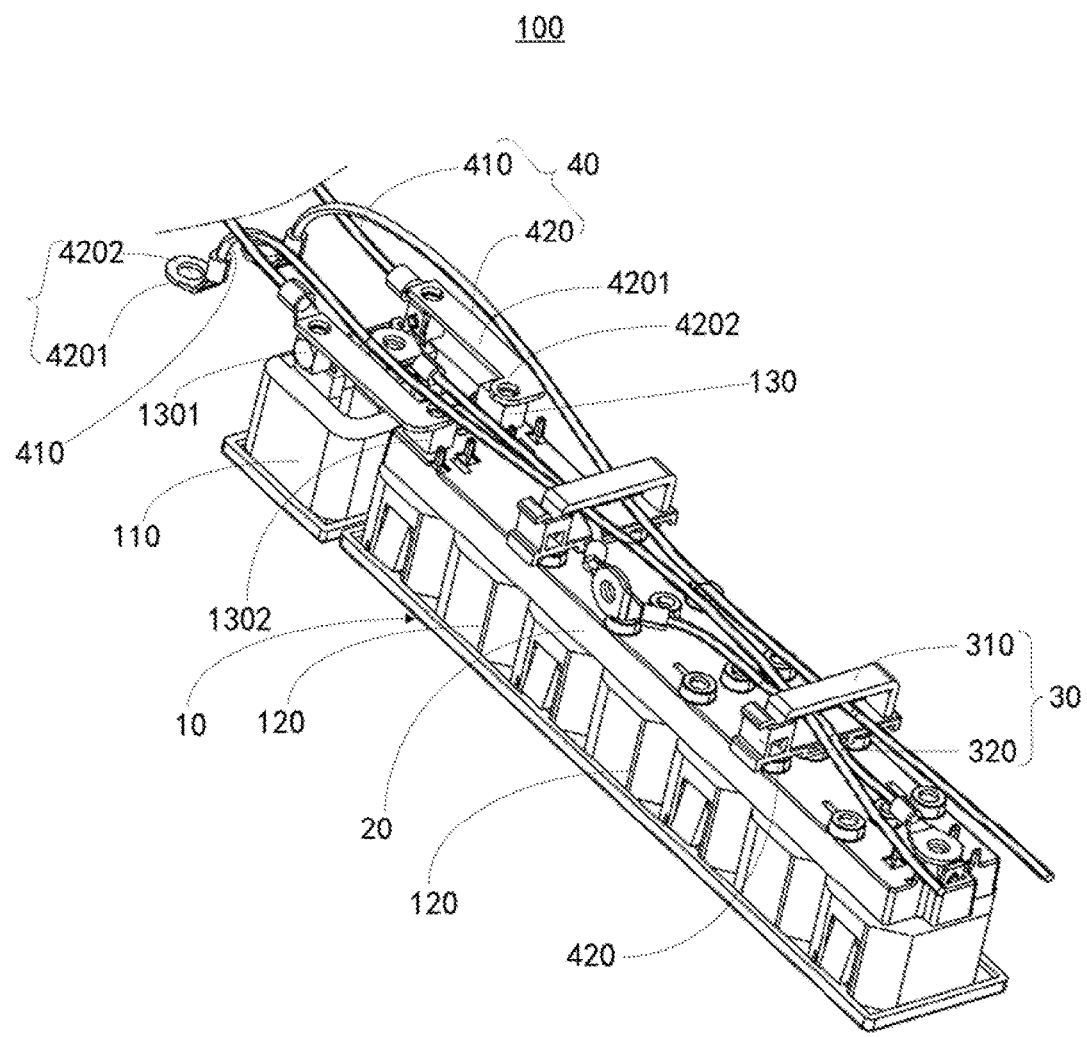
FIG. 1 is an isometric view of an exemplary embodiment of a power distributing unit.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
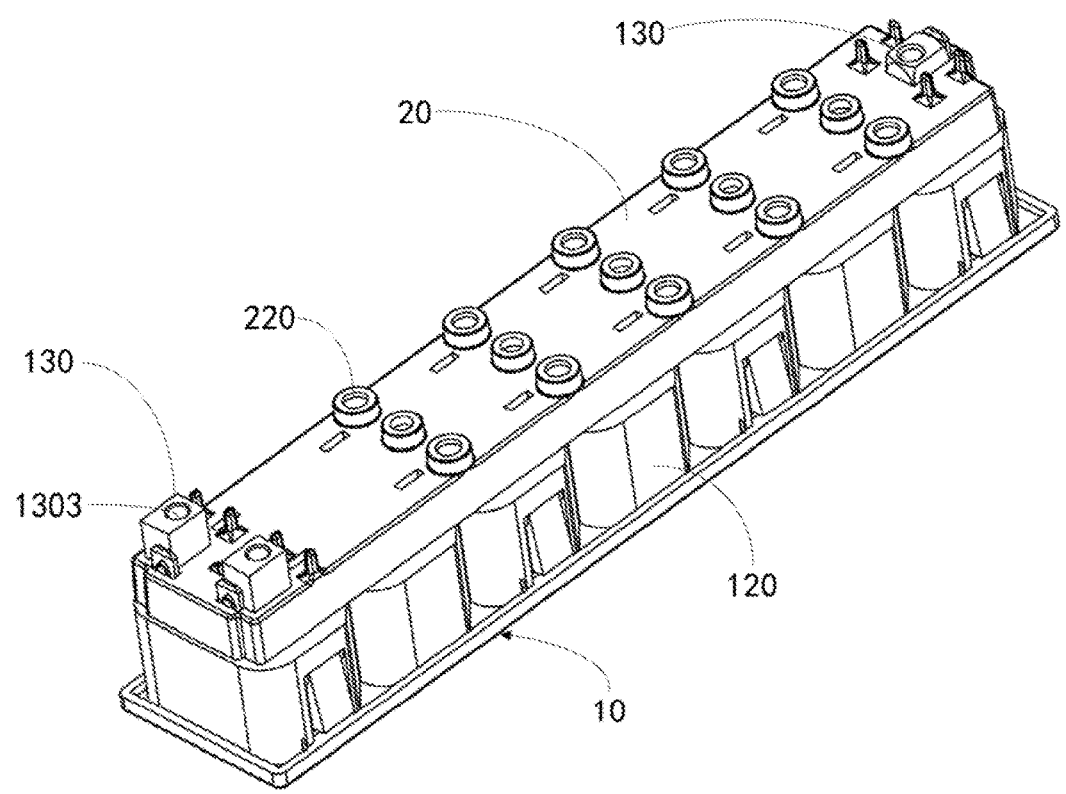
FIG. 2 is an isometric view of the power distributing socket and cover of the power distributing unit of FIG. 1.
Figure 3:
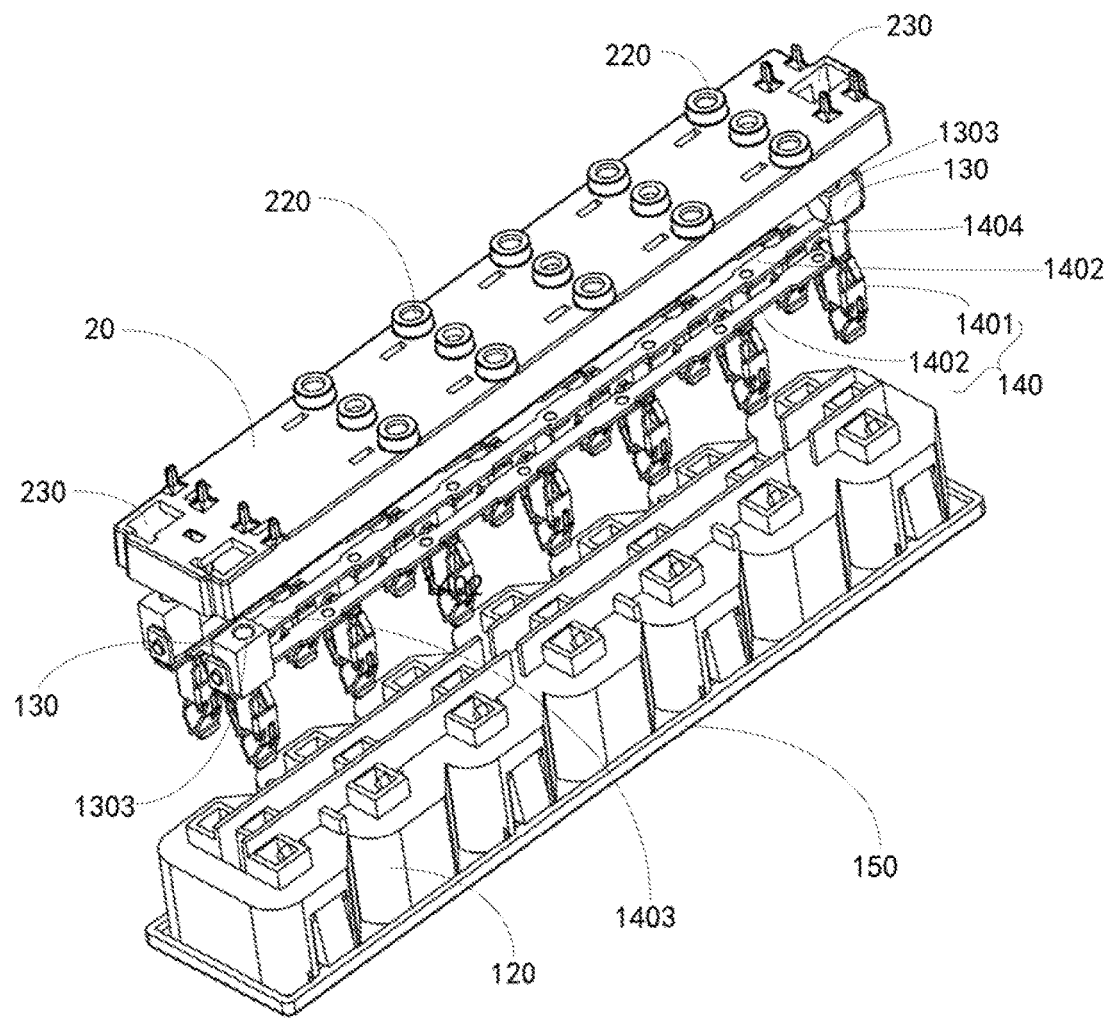
FIG. 3 is an exploded view of the power distributing socket and cover of FIG. 2.

FIGS. 1 to 3 illustrate various portions and views of a power distributing unit 100 in an exemplary embodiment.

The power distributing unit 100 includes a control unit (not explicitly shown), a power distributing socket 10, a plurality of wire fixing members 30, and a plurality of conducting members 40.

The power distributing socket 10 includes an insulating chassis 150 and a circuit unit 140 embedded in the insulating chassis 150. The circuit unit 140 includes an input end 1403, an output end 1404, and two locking terminals 130 respectively connected to the input end 1403 and the output end 1404. Each of the two locking terminals 130 defines a first locking hole 1303.

The insulating chassis 150 includes a top surface and a bottom surface parallel with the top surface. The top surface defines a plurality of power distributing slots.

The plurality of power distributing slots can be either with same specification or with different specifications. For example, the plurality of power distributing slots includes a plurality of first power distributing slots 110 and a plurality of second power distributing slots 120. Correspondingly, the circuit unit 140 can include a plurality of first locking terminals 1301 matching with the first power distributing slots 110 and a plurality of second locking terminals 1302 matching with the second power distributing slots 120. The first power distributing slots 110 can be C19 type and the second power distributing slots 120 can be C13 type.

The circuit unit 140 can include a plurality of clamping portions 1401 corresponding to the first power distributing slots 110 and the second power distributing slots 120, and at least two connecting plates 1402. The connecting plates 1402 are connected to a neutral line (not shown) and a live line (not shown) of the circuit unit 140. The locking terminals 130 are connected to the ends of the connecting plates 1402. The plurality of clamping portions 1401 is connected by the corresponding connecting plates 1402.

In at least one exemplary embodiment, the bottom surface of the insulating chassis 150 defines an accommodating groove (not shown). The circuit unit 140 is received in the accommodating groove.

The power distributing unit 100 further includes a cover 20. The cover 20 defines through holes 230 corresponding to the locking terminals 130. The cover 20 can be mounted to the bottom surface of the insulating chassis 150 to shield the circuit unit 140. The locking terminals 130 protrude from the cover 20 through the through holes 230, and an end of a conducting member 40 is connected to a protruding end of the locking terminals 130, as illustrated in FIG. 1.

The conducting members 40 are used to connect the control unit and the power distributing socket 10. Ends of the conducting members 40 are connected to the circuit unit 140 through the locking terminals 130.

Each of the conductive members 40 can include a wire 410 and two connecting bars 420, a connecting bars 420 is connected to each end of the wire 410.

Each of the two connecting bars 420 can include a connecting spacer 4201 and a second locking hole 4202 defined on the connecting spacer 4201. When the second locking hole 4202 aligns with a first locking hole 1303, a locking member (not shown) can pass through the second locking hole 4202 and engage in the first locking hole 1303 to lock an end of the wire 410 to the circuit unit 140, so that the conductive members 40 can be connected to the circuit unit 140.

The first locking hole 1303 can be a screw hole, the second locking hole 4202 can be a screw hole or a through hole, and the locking member can be a bolt.

In at least one exemplary embodiment, the power distributing unit 100 can further include a plurality of wire fixing members 30 connected to an outer side of the cover 40. The plurality of wire fixing members 30 are distributed along the longitudinal direction of the power distributing socket 10.

Each of the plurality of wire fixing members 30 defines a hole (not labeled) for a wire 40 to pass through.

Each of the wire fixing members 30 can include a holder 310 and a plug 320 connected to each end of the holder 310. The outer side of the cover 20 defines a plurality of fixing slots 220 corresponding to the plugs 320.

The embodiments shown and described above are only examples. Even though numerous characteristics and advantages of the present technology have been set forth in the foregoing description, together with details of the structure and function of the present disclosure, the disclosure is illustrative only, and changes may be made in the details, including matters of shape, size, and arrangement of the parts within the principles of the present disclosure, up to and including the full extent established by the broad general meaning of the terms used in the claims.

What is claimed is:

1. A power distributing socket comprising: an insulating chassis; and a circuit unit embedded in the insulating chassis;
   wherein the circuit unit comprises:
   an input end; an output end; and
   locking terminals respectively connected to the input end and the output end,
   wherein each of the locking terminals defines a first locking hole;
   wherein the power distributing socket further comprises a cover, the cover defines through holes corresponding to the locking terminals, the cover is mounted to the bottom surface, the locking terminals protrude from the cover through the through holes;
   wherein the power distributing socket further comprises conducting members, an end of each of the conducting members is connected to the circuit unit through one of the locking terminals;
   wherein each of the conducting members comprises a wire; and two connecting bars respectively connected to two ends of the wire; wherein each of the two connecting bars comprises a connecting spacer and a second locking hole defined on the connecting spacer;
   wherein the second locking hole aligns with a corresponding first locking hole and a locking member passes through the second locking hole and engages in the first locking hole to lock an end of the wire to the circuit unit.

2. The power distributing socket of claim 1, wherein the first locking hole is a screw hole, the locking member is a bolt.

3. The power distributing socket of claim 1, wherein power distributing socket further comprises a plurality of wire fixing members connected to an outer side of the cover, the plurality of wire fixing members is distributed along a longitudinal direction of the power distributing socket, each of the plurality of wire fixing members defines a via hole for a wire to pass through.

4. The power distributing socket of claim 3, wherein each of the wire fixing members comprises a holder and two plugs respectively connected to two ends of the holder, an outer side of the cover defines a plurality of fixing slots corresponding to the plugs.

5. The power distributing socket of claim 1, wherein the insulating chassis comprises: a top surface; and a bottom surface parallel with the top surface;
   wherein the top surface defines a plurality of power distributing slots, the bottom surface defines a plurality of wiring holes; an end of the each of the locking terminals passes through a wiring hole and connected to a corresponding input end or an output end of the circuit unit, the plurality of power distributing slots is electrically connected to the circuit unit.

6. The power distributing socket of claim 2, wherein the circuit unit comprises:
   two connecting plates respectively connected to a neutral line and a live line of the circuit unit; and a plurality of clamping portions corresponding to the plurality of power distributing slots; wherein the locking terminals are respectively connected to corresponding ends of the two connecting plates.

7. The power distributing socket of claim 2, wherein the bottom surface defines an accommodating groove, the circuit unit is received in the accommodating groove.

8. A power distributing unit comprising a control unit; and
   a power distributing socket connected to the control unit, the power distributing socket comprising:
   an insulating chassis; and
   a circuit unit embedded in the insulating chassis; wherein the circuit unit comprises:
   an input end; an output end; and locking terminals respectively connected to the input end and the output end, wherein each of the locking terminals defines a first locking hole;
   wherein conducting members, an end of each of the conducting members is connected to the circuit unit through one of the locking terminals;
   wherein each of the conducting members comprises a wire; and two connecting bars respectively connected to two ends of the wire; wherein each of the two connecting bars comprises a connecting spacer and a second locking hole defined on the connecting spacer; wherein
   the second locking hole aligns with a corresponding first locking hole and a locking member passes through the second locking hole and engages in the first locking hole to lock an end of the wire to the circuit unit.

9. The power distributing unit of claim 8, wherein the first locking hole is a screw hole, the locking member is a bolt.

10. The power distributing unit of claim 8, wherein the power distributing unit further comprises a plurality of wire fixing members connected to an outer side of the cover, the plurality of wire fixing members are distributed along a longitudinal direction of the power distributing socket, each of the plurality of wire fixing members defines a via hole for a wire to pass through.

11. The power distributing unit of claim 10, wherein each of the wire fixing members comprises a holder and two plugs respectively connected to two ends of the holder, outer side of the cover defines a plurality of fixing slots corresponding to the plugs.

12. The power distributing unit of claim 8, wherein the insulating chassis comprises: a top surface; and a bottom surface parallel with the top surface;
    wherein the top surface defines a plurality of power distributing slots, the bottom surface defines a plurality of wiring holes; an end of the each of the locking terminals passes through a wiring hole and connected to a corresponding input end or an output end of the circuit unit, the plurality of power distributing slots are electrically connected to the circuit unit.

13. The power distributing unit of claim 12, wherein the circuit unit comprises:
    two connecting plates respectively connected to a neutral line and a live line of the circuit unit; and a plurality of clamping portions corresponding to the plurality of power distributing slots;

wherein the locking terminals are respectively connected to the ends of the connecting plates.

14. The power distributing unit of claim 12, wherein the bottom surface defines a accommodating groove, the circuit unit is received in the accommodating groove.

15. The power distributing unit of claim 14, wherein the power distributing unit further comprises a cover, the cover defines through holes corresponding to the locking terminals, the cover is mounted to the bottom surface, the locking terminals protrude out of the cover through the through holes.

* * * * *